United States Patent [19]
Vos

[11] Patent Number: 5,582,753
[45] Date of Patent: Dec. 10, 1996

[54] METHOD OF HEATING A STRIP-SHAPED CARRIER IN AN OVEN AND DEVICE FOR FASTENING AT LEAST ONE COMPONENT ON A STRIP-SHAPED CARRIER

[75] Inventor: Jan Vos, Eindhoven, Netherlands

[73] Assignee: U.S. Philips Corporation, New York, N.Y.

[21] Appl. No.: 353,041

[22] Filed: Dec. 9, 1994

[30] Foreign Application Priority Data

Oct. 12, 1993 [BE] Belgium ................ 09301371

[51] Int. Cl.⁶ .................. F27B 9/06; F27B 9/28; F27B 9/40
[52] U.S. Cl. .................. 219/388; 228/8; 228/25; 432/229
[58] Field of Search .................. 219/388, 216; 392/417; 228/8, 9, 25, 179.1, 180.1, 180.21; 432/8, 121, 229; 34/419, 420, 445, 446, 494, 800, 543, 544, 553; 355/285, 286; 101/487, 467

[56] References Cited

U.S. PATENT DOCUMENTS 4,805,531  2/1989  Sarda ........................ 101/488
4,889,277  12/1989  Zahn ........................ 228/180.21

OTHER PUBLICATIONS

"Surface Mount Assembly Equipment" from Philips Electronics N.V., of Feb. 1993.

*Primary Examiner*—Teresa J. Walberg
*Assistant Examiner*—J. Pelham
*Attorney, Agent, or Firm*—Arthur G. Schaier

[57] ABSTRACT

A method, oven, and device for heating a strip-shaped carrier in an oven, which carrier is passed through the oven by a transport device, while the oven is displaced in a direction opposed to the transport direction when a malfunction is detected in the supply or removal of the strip-shaped carrier.

10 Claims, 2 Drawing Sheets

METHOD OF HEATING A STRIP-SHAPED CARRIER IN AN OVEN AND DEVICE FOR FASTENING AT LEAST ONE COMPONENT ON A STRIP-SHAPED CARRIER

BACKGROUND OF THE INVENTION

1. Field of the Invention

The invention relates to a method of heating a strip-shaped carrier in an oven, which carrier is passed through the oven in a transport direction.

The invention further relates to a device for fastening at least one component on a strip-shaped carrier.

2. Description of the Prior Art

Such a method and device are known from the brochure "Surface Mount Assembly Equipment" from Philips Electronics N. V., of February 1993. A printed circuit board (the strip-shaped carrier) which is provided with solder and with components placed on the solder is passed through an oven, so that the solder melts in the oven and a mechanical connection between the components and the printed circuit board is formed.

If the oven is used for heating a comparatively long strip-shaped carrier, only a portion of the strip-shaped carrier being present in the oven at any time, malfunctions such as interruptions or decelerations in the supply or removal of the remainder of the strip-shaped carrier may take place, whereby the strip-shaped carrier is not or too slowly transported in the transport direction. As a result, the portion of the strip-shaped carrier present in the oven remains in the oven too long and is overheated and damaged. Switching-off of the oven in the case of malfunctions offers no solution because the oven cools down only slowly.

The invention has for its object to provide a method whereby the above disadvantages are avoided.

SUMMARY OF THE INVENTION

The method according to the invention is for this purpose characterized in that the oven is displaced in a direction opposed to the transport direction when a malfunction in the supply or delivery of the strip-shaped carrier is detected.

In the case of a malfunction, which is detected, for example, by sensors, the strip-shaped carrier is no longer transported in the transport direction. To prevent overheating, the oven is displaced in a direction opposed to the transport direction, so that the portions of the carrier already heated can cool down. In addition, a relative movement of the strip-shaped carrier against the oven is maintained, so that portions of the strip-shaped carrier not yet heated are heated by the oven.

An embodiment of the method according to the invention is characterized in that the oven is displaced in the transport direction after the malfunction.

Thus it is possible at a subsequent malfunction for the oven to be displaced in a direction opposed to the transport direction again, while the distance over which the oven is displaceable may be comparatively small.

Another embodiment of the method according to the invention is characterized in that the strip-shaped carrier, which is flexible, is guided so as to form a buffer loop situated in front of and/or beyond the oven, the oven being displaced in a direction opposed to the transport direction whenever a malfunction in a buffer loop is detected.

A buffer may be formed in the strip-shaped carrier, if the latter is flexible, by means of a loop, so that comparatively short malfunctions can be accommodated and the oven need not be displaced at each and every malfunction. If a malfunction occurs in the buffer loop as a result of which the carrier can no longer be transported through the oven, then the oven will be displaced in a direction opposed to the transport direction so as to maintain a relative movement of the strip-shaped carrier against the oven.

Yet another embodiment of the method according to the invention is characterized in that the oven is displaced in a direction opposed to the transport direction when it is detected that the buffer present in front of the oven is full.

When the buffer is empty, the strip-shaped carrier in the oven is no longer transported in the transport direction, but the oven is displaced in a direction opposed to the transport direction, towards the buffer. After the malfunction, the strip-shaped carrier in front of the buffer is transported in the transport direction again, while the strip-shaped carrier is not yet transported in the oven, so that the buffer is filled. The oven is displaced towards the buffer during filling of the buffer so as to maintain a relative movement of the strip-shaped carrier against the oven.

A further embodiment of the method according to the invention is characterized in that the buffer situated in front of the oven is filled before the oven is displaced in the transport direction.

Comparatively short malfunctions can be accommodated by a full buffer loop, so that the oven need not be displaced at each and every malfunction.

A further embodiment of the method according to the invention is characterized in that the oven is displaced in a direction opposed to the transport direction when it is detected that the buffer situated beyond the oven is full.

Comparatively short malfunctions in the removal of the strip-shaped carrier may be accommodated by means of the buffer loop situated beyond the oven. When this buffer is full, the strip-shaped carder is no longer transported in the transport direction in and beyond the oven. A relative movement of the strip-shaped carder against the oven is maintained in that the oven is displaced in a direction opposed to the transport direction.

The invention also has for its object to provide a device for fastening at least one component on a strip-shaped carder which is being passed through the device in a transport direction, such that the disadvantages of the known device are avoided.

The device according to the invention is for this purpose characterized in that the device is provided with a component placement mechanism for placing the component on the strip-shaped carder, while the device is further provided with an oven which is displaceable in the transport direction and in a direction opposed thereto, while the component placement mechanism is situated before the oven seen in the transport direction.

Components are placed on the strip-shaped carrier, which is provided with solder, upon which the solder is melted in the oven and the components are connected to the strip-shaped carrier. Malfunctions in the transport of the strip-shaped carrier can be accommodated by means of the displaceable oven, and overheating of the strip-shaped carrier is prevented. A buffer may be formed between the oven and the component placement mechanism so that malfunctions in the component placement mechanism can be corrected and the oven need not be displaced in the case of comparatively short malfunctions.

An embodiment of the device according to the invention is characterized in that the device is provided with a test unit for testing an electric circuit on the carrier comprising components placed on the carrier by the component placement mechanism, which test unit is situated beyond the oven seen in the transport direction.

It is checked in the test unit whether the electric circuit formed on the strip-shaped carrier functions correctly. A buffer may be formed between the oven and the test unit so that malfunctions in the test unit can be accommodated and the oven need not be displaced in the case of comparatively short malfunctions.

The invention will be explained in more detail with reference to the drawing, in which

BRIEF DESCRIPTION OF THE DRAWINGS

Corresponding parts have been given the same reference numerals in the various Figures.

DETAILED DESCRIPTION OF THE PREFERRED EMBODIMENTS

Figure 1:
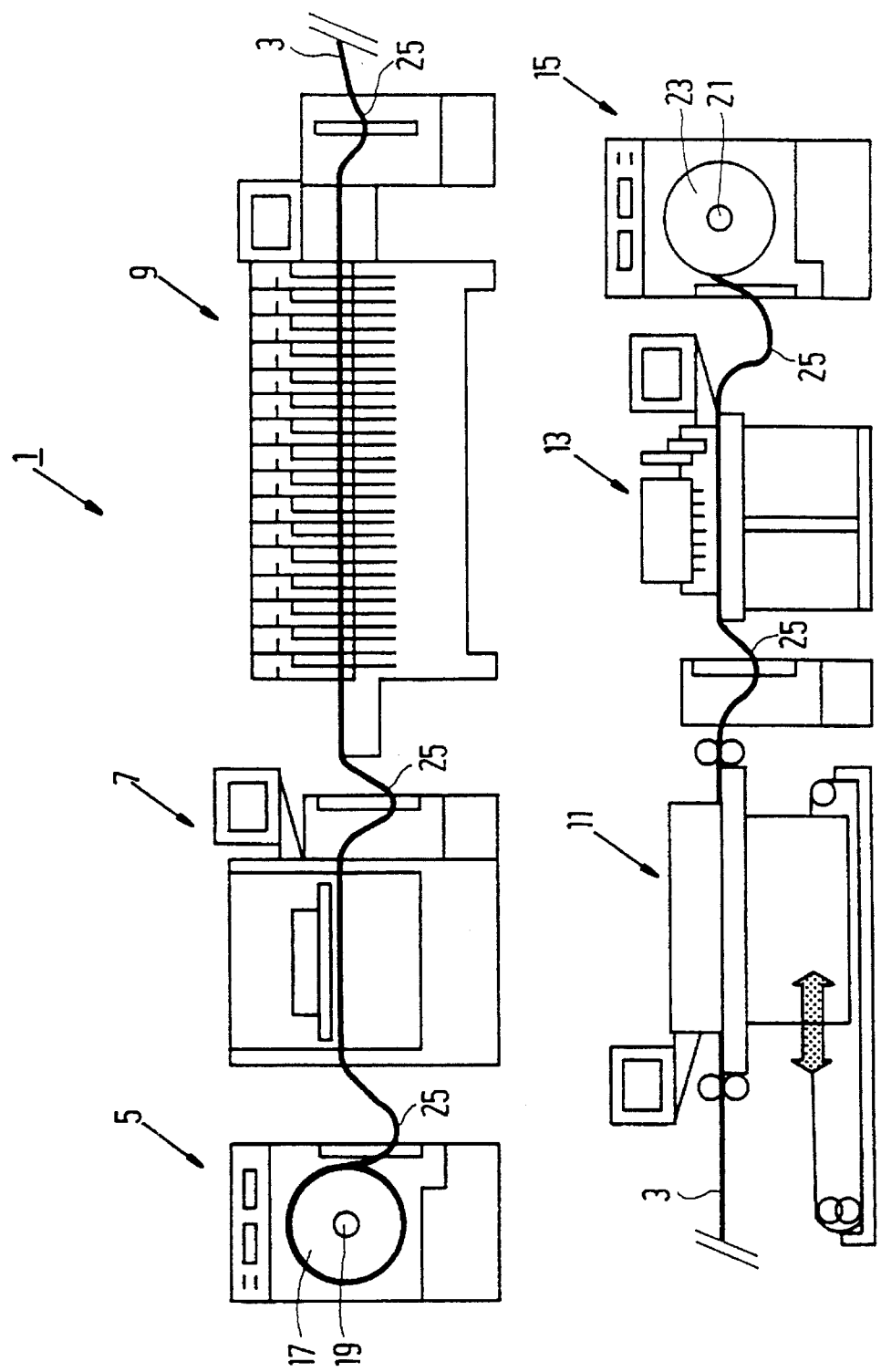
FIG. 1 is a diagrammatic side elevation of a device according to the invention with fringe equipment.

FIG. 1 shows a device 1 for placing and fastening electronic components on a foil (strip-shaped carrier) 3, for example made of polyimide, and provided with an electrical conductor pattern. The device 1 is provided with a delivery stand 5, a printing device 7, a component placement mechanism 9, an oven 11, a test unit 13, and a receiving stand 15. The foil 3 wound in a roll 17 is passed over a shaft 19 of the delivery stand 5. The unreeled foil 3 is provided with soldering paste in a printing device 7 by means of a stencil. Then the foil 3 is provided with components in the component placement mechanism 9, after which the components are connected to the foil 3 in the oven 11 after melting of the soldering paste. The electric circuits formed on the foil 3 are subsequently tested in the test unit 13. Finally, the foil 3 is rolled up again on a shaft 21 of the receiving stand 15 so as to form a roll 23. The delivery stand 5, printing device 7, component placement mechanism 9, test unit 13, and receiving stand 15 are devices which are known per se. Between the various devices, buffers are formed in the foil 3 by means of loops 25, so that, whenever a malfunction takes place in one of the devices, the other devices can continue operating for some time before these devices also have to be stopped. The lengths of the loops are so chosen that the buffer will not become exhausted in the case of an average delay caused by a malfunction. The minimum and maximum admissible lengths of the loops are monitored by optical sensors, so that the devices can be stopped, accelerated or decelerated in time. Any fracture in the foil 3 is also detected by optical sensors.

Figure 2:
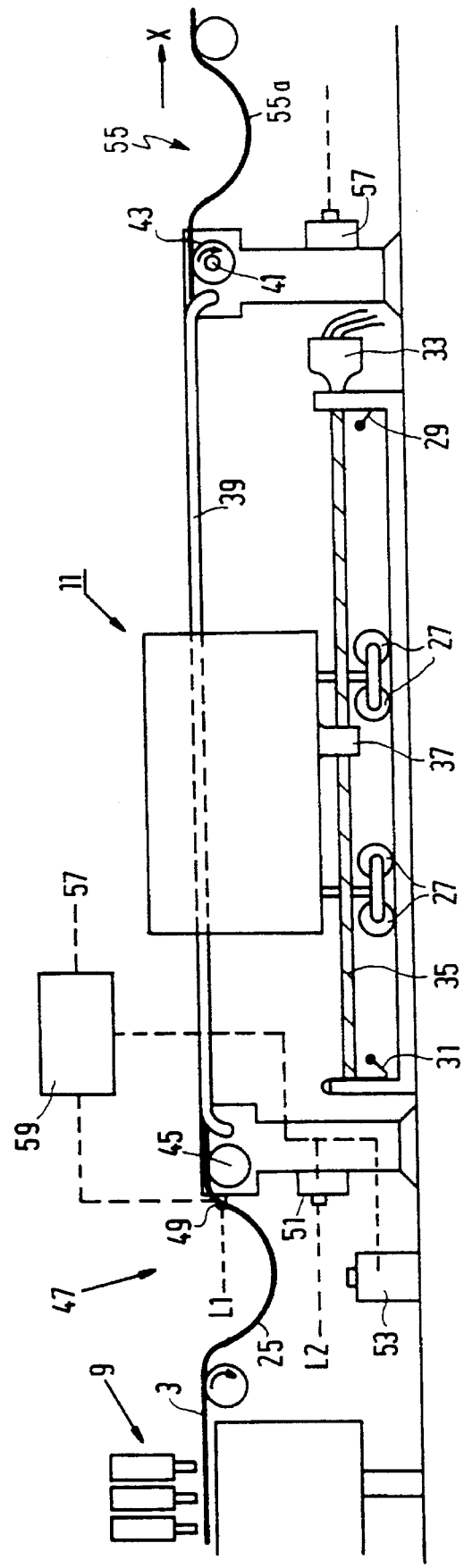
FIG. 2 shows an oven according to the invention.

FIG. 2 shows an oven 11 which is movable on wheels 27 from a first stop 29 to a second stop 31 by means of a fixed motor 33. The motor 33 drives a threaded spindle 35, so that a nut 37 fastened to the oven 11 is displaced over the spindle 35, and the oven 11 is displaced in or against the transport direction. The foil 3 is supported in the oven 11 by a plate 39 and is transported through the oven 11 in the transport direction X by means of a friction roller 43 driven by a motor 41. The foil 3 is tensioned by a tensioning roller 45 which is driven in a direction opposed to that of the friction roller 43. A buffer 47 is present in front (on the upstream side) of the oven 11, formed by a loop 25 in the foil 3. The minimum and maximum admissible lengths of the loop 25 are determined by means of optical sensors, a first sensor 49 detecting a minimum level L1 and a second sensor 51 a maximum level L2. A sensor 53 detects any fracture of the foil 3 in the loop 25 of the buffer 27. The maximum length of the foil 3 in the loop 25 is $LL_{max}$. Seen in the transport direction X, a buffer 55 is situated beyond (on the downstream side) the oven 11. A buffer loop 55a is formed in buffer 55, maximum admissible length of which is detected by a sensor 57.

The oven 11 is further provided with a control unit 59 which processes the signals coming from the sensors 49, 51, 53, 57 and controls the displacement of the oven 11. The control unit 59 also monitors and controls the temperature in the oven 11.

In the following description:

LL is the length of the foil 3 in loop 25 of buffer 47;

$LL_{max}$ is the maximum length of the foil 3 in loop 25 of buffer 47;

$V_{foven}$ is the absolute speed of the foil 3 in the oven 11 (determined by the motor 41 );

$V_{oven}$ is the absolute speed of the oven 11 (determined by the motor 33);

$V_{frel}$ is the relative speed of the foil 3 against the oven 11, with $V_{frel} = V_{fove} - V_{oven}$;

$V_{frelmin}$ is the minimum admissible relative speed of the foil 3 in the oven 11 at which the foil 3 is not overheated;

$V_{frelmax}$ is the maximum admissible relative speed of the foil 3 in the oven 11 at which the foil 3 is heated sufficiently;

$V_{frelmin} \leq V_{frel} \leq V_{frelmax}$;

$V_{foven} \leq V_{frelmax}$;

$V_{fcomp}$ is the speed of the foil 3 in the component placement mechanism 9.

The choice is made: $V_{frel} \geq V_{fcomp}$ in order to ensure that the component placement mechanism 9 need be stopped as little as possible.

A situation is assumed in which the oven 11 is in an initial position against the stop 29, the buffer 47 is partly filled, the foil speed $V_{foven} = V_{frelmax}$, and the oven 11 is stationary: $V_{oven} = 0$. Since the speed $V_{foven}$ of the foil 3 in the oven 11 is greater than the speed $V_{fcomp}$ in the component placement mechanism 9, the loop 25 in the buffer 47 will become shorter. This takes place irrespective of whether a malfunction occurs in the path preceding the oven 11. The moment no foil 3 is detected by the sensor 49, the motor 41 is switched off and foil transport in the oven 11 is stopped: $V_{foven} = 0$. The motor 33 is activated and the oven 11 is displaced in the direction of the buffer 47. The speed of the oven 11 is kept as low as possible so as to have available a maximum time before the oven 11 rests against the stop 31: $V_{oven} = -V_{frelmin}$. The relative speed of the foil 3 in the oven 11 here is $V_{frel} = V_{foven} - V_{oven} = V_{frelmin}$. The oven 11 is displaced towards the buffer 47 until the sensor 51 detects foil 3 and the level L2 of the buffer 47 has been reached.

The moment the buffer 47 is full, the motor 41 is switched on so that the foil 3 is transported through the oven 11 with a speed $V_{foven} = V_{frelmax}$, and the motor 33 is reversed, so that the oven 11 is transported in the direction of the initial position against the stop 29. The oven 11 is transported into the initial position as quickly as possible, however, the oven must not be transported over foil 3 which had already been heated, and a minimum speed difference $V_{frel} = V_{frelmin}$ between oven 11 and foil 3 must be guaranteed. The oven 11 is displaced into the initial position with a speed $V_{oven} = V_{foven} = V_{frel} = V_{frelmax} - V_{frelmin}$.

During the displacement of the oven 11 into the initial position the length of the buffer 47 will decrease because $V_{fcomp} < V_{foven}$. The length of the buffer 47 is chosen such that the buffer 47 is not yet empty the moment the oven 11 reaches the initial position against stop 29. Some time after that the buffer 47 will be empty again, and the cycle described above will be repeated.

In an experiment the values were:

$LL_{max}$=100 mm $V_{fcomp}$=2.5 mm/s $V_{frelmin}$=1.6 mm/s $V_{frelmax}$=2.6 mm/s.

The moment the buffer 47 is empty, at which the length LL of the loop 25 is zero, LL=0, the foil 3 is stopped in the oven 11, $V_{foven}$=0, and the oven 11 is moved towards the buffer 47, $V_{oven}$=−1.6 mm/s. The buffer 47 is filled in $t_{fill} = LL_{max}/V_{fcomp} = 100/2.5 = 40$ s. The oven 11 has been displaced over a distance $L_{oven} = V_{oven} t_{fill} = -V_{frelmin} t_{fill} = -1.6 \times 40 = -64$ mm during $t_{fill}$. The oven 11 is subsequently displaced towards the stop 29 with a speed $V_{oven} = V_{frelmax} - V_{frelmin} = 2.6 - 1.6 = 1$ mm/s. The oven 11 reaches the stop 29 after $t_{return} = L_{oven}/V_{oven} = 64/1 = 64$ S. The buffer has become shorter during $t_{return}$ by $t_{return}(V_{foven} - V_{fcomp}) = 64 \times 0.1 = 6.4$ mm. The buffer 47 will be empty again after a period $t_{empty} = (LL_{max} - 6.4)/(V_{foven} - V_{fcomp}) = (100 - 6.4)/0.1 = 936$ s after the oven 11 has reached the stop 29.

If there is a malfunction in the transport of the foil 3 in front of the oven 11, whereby $V_{fcomp}$ becomes 0 mm/s, the buffer 47 will be empty sooner, and the oven 11 will be transported towards the buffer 47 sooner. When the oven 11 has been transported up to against the stop 31, the oven 11 is stopped and switched off. Since the oven 11 cools down relatively slowly, the portion of the foil 3 present in the stationary oven 11 may become overheated. This portion must be given an additional check and, if necessary, be discarded.

If the sensor 57 detects foil 3, the buffer 55 is full. This may take place, for example, when the foil 3 beyond the oven 11 is no longer transported in the transport direction X. The foil transport in the oven 11 is then stopped and the oven 11 is transported towards the buffer 47 in the manner described above. Since no foil transport takes place in and beyond the oven 11, the buffer in front of the oven 11 will be filled comparatively quickly. The buffer 47 is also full the moment the sensor 51 detects foil 3. The component placement mechanism 9 is stopped then. The oven 11 is moved into the initial position again the moment the foil transport beyond and in the oven 11 is resumed.

During normal production, the foil 3 is transported stepwise through the component placement mechanism 9, whereas it is passed through the oven 11 at a continuous rate. The buffer 47 compensates the fluctuations caused thereby.

It is also possible to keep a normal speed $V_{foven}$ smaller than $V_{fcomp}$. The buffer 47 then fills up comparatively quickly. The moment the buffer 47 is full, the speed of the foil in the oven 11 is increased temporarily, during which $V_{foven} \geq V_{fcomp}$. The speed of the foil in the oven 11 is reduced again the moment the buffer 47 is empty. The oven 11 need not be displaced then during a continuous production. However, if the component displacement mechanism becomes idle during a longer period, so that the buffer 47 is no longer filled up and becomes empty after some time, upon which the foil transport in the oven 11 is stopped, then the oven 11 is displaced towards the buffer 47 in order to prevent overheating of the foil. The oven is also displaced towards the buffer 47 to prevent foil overheating when the test unit becomes idle for a longer period, whereby the buffer 55 is not emptied and becomes full, which also stops the foil transport in the oven 11.

The components lie in the sticky soldering paste provided on the foil 3 in the range between the component placement mechanism 9 and the oven 11. To reduce the risk of components dropping from the foil 3 in the buffer 47, the maximum length of the loop 25 of the buffer 47 was empirically determined. After the oven 11, the components are fixed to the foil and can no longer drop off. The maximum length of the loop 25 of buffer 55 may then be comparatively great.

Although the invention was described with reference to heating of a flexible foil in an oven, it is alternatively possible to pass a chain with rigid printed circuit boards in a transport direction through the oven, the oven being displaced in a direction opposed to the transport direction when a malfunction occurs in the supply or delivery of the chain.

What is claimed is:

1. A method of heating a strip-shaped carrier in an oven, which carrier is passed through the oven in a transport direction, said method comprising the steps of detecting a malfunction in the supply or delivery of the strip-shaped carrier and displacing the oven in a direction opposed to the transport direction after said malfunction is detected.

2. The method as claimed in claim 1, including the step of displacing the oven in the transport direction after the malfunction has been corrected.

3. The method as claimed in claim 1, including the step of guiding the strip-shaped carrier so as to form a buffer loop in a buffer on at least one of the upstream and downstream side of the oven, the oven being displaced in a direction opposed to the transport direction when a malfunction in a buffer loop is detected.

4. The method as claimed in claim 3, including the step of displacing the oven in the transport direction when it is detected that the buffer disposed on the upstream side of the oven is full.

5. The method as claimed in claim 4, including the step of filling the buffer situated on the upstream side of the oven before the oven is displaced in the transport direction.

6. The method as claimed in claim 3, including the step of displacing the oven in a direction opposed to the transport direction when it is detected that the buffer disposed on the downstream side of the oven is full.

7. A device for fastening at least one component on a strip-shaped carrier which is passed through said device in a transport direction, the device comprising a component placement mechanism for placing the component on the strip-shaped carrier, and an oven which is displaceable in the transport direction and in a direction opposed thereto in response to the movement of the strip-shaped carrier through said device, the component placement mechanism being disposed on the upstream side of the oven.

8. The device as claimed in claim 7, wherein the device is provided with a test unit for testing an electric circuit on the carrier comprising components placed on the carrier by the component placement mechanism, said test unit being disposed on the downside of the oven.

9. The method as claimed in claim 2, including the step of guiding the strip-shaped carrier so as to form a buffer loop in a buffer on at least one of the upstream and downstream side of the oven, the oven being displaced in a direction opposed to the transport direction when a malfunction in a buffer loop is detected.

10. The method as claimed in claim 4, including the step of displacing the oven in a direction opposed to the transport direction when it is detected that the buffer disposed on the downstream side of the oven is full.

* * * * *